Oct. 20, 1970 B. H. PINCKAERS 3,535,561
ADJUSTABLE DIFFERENTIAL AMPLIFIER SYSTEM INCLUDING
FEEDBACK AMPLIFIER MEANS
Filed Oct. 28, 1968 2 Sheets-Sheet 1

INVENTOR.
BALTHASAR H. PINCKAERS
BY Alfred N. Feldman
ATTORNEY.

INVENTOR.
BALTHASAR H. PINCKAERS
BY Alfred N. Feldman
ATTORNEY.

United States Patent Office 3,535,561
Patented Oct. 20, 1970

3,535,561
ADJUSTABLE DIFFERENTIAL AMPLIFIER SYSTEM INCLUDING FEEDBACK AMPLIFIER MEANS

Balthasar H. Pinckaers, Edina, Minn., assignor to Honeywell Inc., Minneapolis, Minn., a corporation of Delaware Filed Oct. 28, 1968, Ser. No. 771,529
Int. Cl. G05d *23/20*
U.S. Cl. 307—310 8 Claims

ABSTRACT OF THE DISCLOSURE

A solid state temperature control system that uses a bridge and amplifier network to control a heating load and a cooling load through a fixed interstage temperature differential or deadband by means of a fixed amplifier stage and a second amplifier stage which can be selectively varied. The second or variable stage can be adjusted for operation by varying an impedance in a feedback circuit. This adjustment shifts the operating point of the stage without changing the operating characteristics of the stage.

BACKGROUND OF THE INVENTION

The present invention is of particular utility in the field of temperature control as the invention allows for the automatic switching from heating to cooling in a system and for the variation of the difference between the heating and cooling setpoints or deadband by the adjustment of one imepdance in the system. In most temperature control systems the selection of heating or cooling is accomplished by the positioning of a manual switch and therefore is substantially different than the present system. In other heating and cooling systems where automatic changeover from heating to cooling is accomplished, any adjustment of the deadband between heating and cooling usually changes the characteristic of the heating or cooling amplifier circuit and thereby changes other characteristics of the system. This change in characteristics of the system with a change in the deadband is not desirable and is overcome by the present invention.

SUMMARY OF THE INVENTION

The present invention is directed particularly to a solid state adjustable amplifier system that can be used in conjunction with a differential condition responsive system. The invention provides for a means of adjusting the differential response of the system and has been specifically disclosed in connection with a solid state temperature control system for control of a heating load and a cooling load.

The adjustable amplifier of the disclosed invention utilizes feedback to the source that supplies the signal to the system and allows for adjustment of the amount of feedback thereby controlling the total current conduction of the feedback stage. This feedback controlled stage drains current from the final output stage until the controlled stage is saturated and then the current is allowed to flow in the final output stage to provide the necessary control or output function. The final output stage is driven by or controlled from a voltage divider means that can be made up of a uniform impedance or can be made up of a diode and impedance in series. Slightly different characteristics are obtained by the two different driving circuit arrangements but the overall function of the adjustable amplifier remains the same.

In the present invention, which is disclosed as part of a temperature control system, the amplifier output stage of the system which controls the heating load is fixed in relationship to a control or setpoint temperature. The cooling control output amplifier is adjustable with respect to the setpoint temperature merely by setting the value of a resistance in the feedback circuit. In this way a simple means is provided for adjusting the difference between the operating temperatures of the cooling load and the heating load. This is referred to as the deadband of the system and with the present system the deadband can be made readily adjustable over a narrow or wire range without changing any other characteristic of the system.

DESCRIPTION OF THE PREFERRED EMBODIMENT

Figures 1, 4:
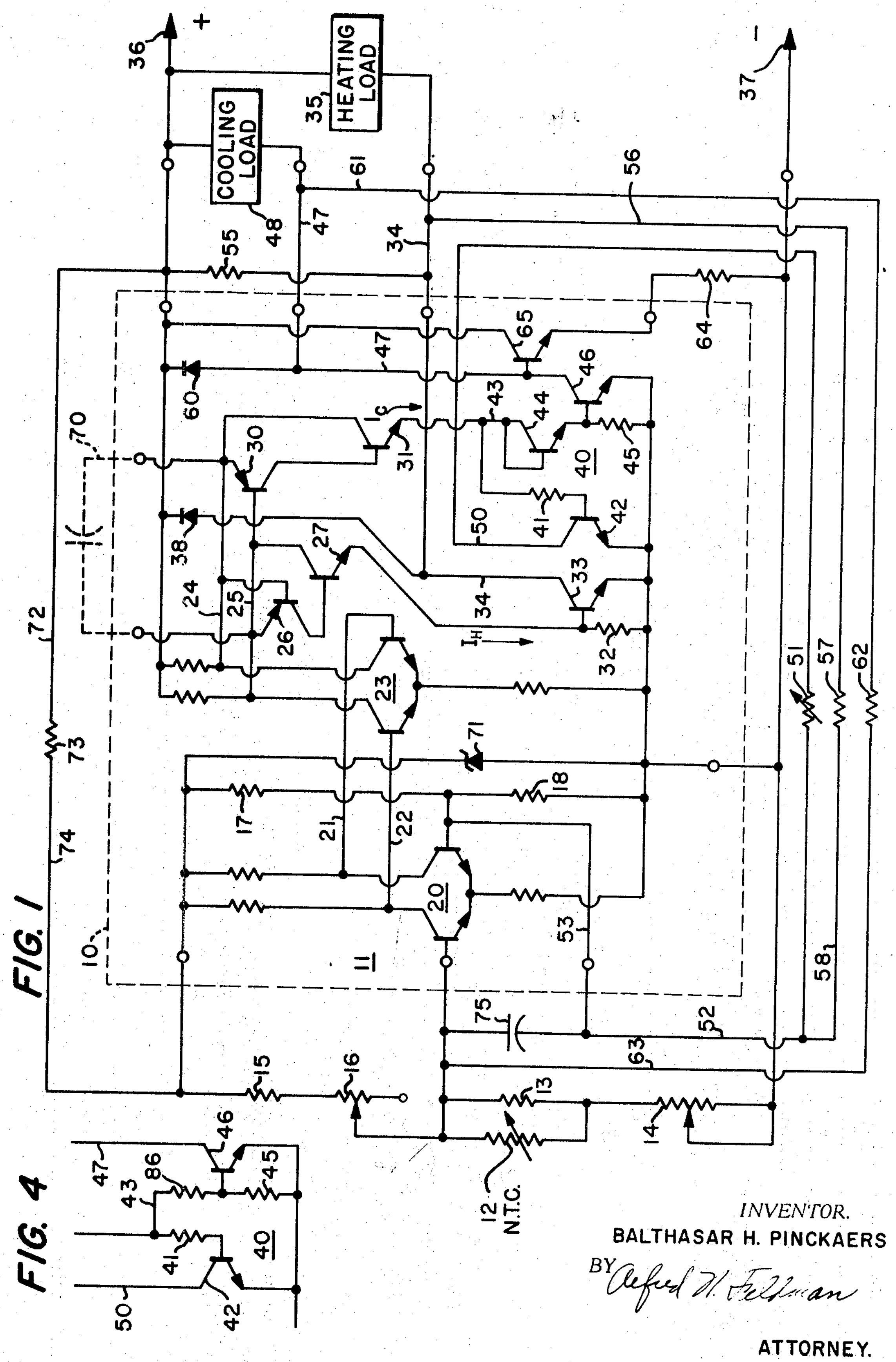
FIG. 1 discloses a circuit diagram of a complete temperature control system wherein a differential bridge amplifier arrangement shown to be in integrated form controls a heating load and a cooling load.
FIG. 4 is a partial schematic of a modification of the driving circuit of the adjustable amplifier circuit.

In FIG. 1 a complete temperature control system is disclosed. The system includes a number of discrete components, primarily resistors, and one ten-terminal integrated circuit 10. The ten-terminal integrated circuit 10 contains a number of transistors and resistors which make up various functional circuits, and in certain cases stages are cascaded in order to obtain the necessary amplification for the present system. The ten-terminal integrated circuit 10 could be completely replaced by circuitry in discrete component form wherein less transistors would be used since discrete PNP transistors may be obtained that have a higher current gain than the PNP transistors in integrated form on a N-oriented chip. The particular form of makeup is immaterial and the present FIG. 1 discloses an actual circuit as developed and integrated for use in a heating and cooling application. The balance of this discussion will disregard the integrated form and will merely discuss the components as if they were individual discrete elements.

A bridge means 11 is provided which includes a negative temperature coefficient thermistor 12 paralleled by a resistor 13 which combination is in series with a variable resistance or setpoint adjustment 14. The thermistor 12, resistor 13, and resistor 14 form one leg of the bridge means 11. A second leg is formed by the series resistance combination of resistor 15 and calibration potentiometer 16. The bridge also includes resistors 17 and 18 which form its two remaining legs. The output of the bridge means 11 is by way of amplifier means 20 which has a differential output on conductors 21 and 22. The conductors 21 and 22 lead to a second differential amplifier means 23 which has its output on conductors 24 and 25. A first polarity of output on conductors 24 and 25 is amplified by a pair of cascaded transistors 26 and 27. Transistors 26 and 27 would be replaced by a single transistor in a discrete component configuration. The opposite polarity or phase output on conductors 24 and 25 is amplified by transistors 30 and 31 which are cascaded and also could be replaced by a single transistor in a discrete component form. To the present point in the description of the circuit of FIG. 1, a bridge and differential amplifier output arrangement has been disclosed wherein a call for heat or an unbalance of the bridge means 11 indicating that the temperature at thermistor 12 is too low, causes transistor 27 to conduct. If the reverse is true, that is if the temperature at thermistor 12 is too high and the bridge means 11 is unbalanced, the transistor 31 conducts.

Conduction from transistor 27 is through a resistor 32 that forms a bias to control a transistor 33 which has a conductor 34 connected to its collector. The conductor 34 connects to a heating load means 35 to control current flow through the heating load means 35 between a positive supply terminal 36 and a negative supply terminal 37. Connected between conductor 34 and the supply 36 is a free-wheeling diode 38 to allow for the control of an inductive load, in a conventional fashion.

The output or conduction from transistor 31 is supplied to an adjustable amplifier means generally disclosed at 40. The amplifier means 40 is made up of a resistor 41 in series with transistor 42 so that current flowing from transistor 31 can be conducted through the base-emitter circuit of the transistor 42 by means of resistor 41 when the transistor is in operation. The transistor 31 also can cause current to conduct through conductor 43 to a diode 44 (diode 44 has been disclosed as a transistor with its base and collector shorted together, as is one conventional way of integrating a diode) and a resistor 45. The resistor 45 acts as a bias resistor for an output transistor 46 that is connected by conductor 47 to a cooling load means 48 that in turn is connected to the positive supply 36.

The transistor 42 has an input from transistor 31 through the resistor 41 and has an output conductor 50 connected through a variable impedance means shown as a resistance 51. The resistor or impedance means 51 is connected by conductors 52 and 53 to one side of the differential amplifier means 20. The conductor 50, impedance means 51, conductor 52, and conductor 53 form a negative feedback arrangement for the transistor 42 to the input or signal source means of the system. In order to complete the heating portion of the system so as to function properly, the heating load means 35 is paralleled by a heat anticipating resistor 55 which will draw current through conductor 34 whenever the transistor 33 conducts. The heat anticipating resistor 55 being in parallel with the heating load means 35 is thereby energized with the heating load means 35 and provides heat as is conventional in thermostat or temperature control work. Also connected to conductor 34 is a further conductor 56, a resistor 57 and a conductor 58 that in turn is connected to the conductors 52 and 53. The circuit made up of conductor 56, resistor 57, and conductor 58 provides a positive feedback to the signal source means or bridge means 11 so that whenever the heating load means 35 is energized, a positive feedback causes the transistor 33 to operate as a switch.

The cooling load means circuit includes a free-wheeling diode 60 that is placed across the cooling load means 48 in case it is inductive in nature, as is conventional. The conductor 47 further is connected through conductor 61 and resistor 62 by means of conductor 63 to the differential amplifier means 20. This circuit provides a positive feedback during cooling operations and causes transistor 46 to act as a switch when the cooling load means 48 is energized. A cooling anticipation resistor 64 is provided in series with a transistor 65 which is energized from the source 36. The cooling anticipation resistor 64 provides a heat function that is conventional in the thermostat art to provide heat to the thermostat whenever the cooling load is deenergized. Therefore, the transistor 65 is in conduction when the cooling load means is inactive and transistor 46 is not conducting.

A capacitor 70 is disclosed as being optionally connected between the emitters of transistors 26 and 30. This capacitor can be utilized if a slight time delay is desired in the switching between one mode of operation and the other. This capacitor does not affect the present invention. To complete the circuit, a Zener diode 71 is placed across the bridge means 11 to stabilize the voltage that appears across the bridge by means of conductor 72 and resistor 73 through conductor 74 from the positive terminal 36 of the voltage source supplied between terminals 36 and 37. A transient suppression capacitor 75 is provided across the differential amplifier means 20.

OPERATION

If it is presumed that the temperature sensed by thermistor 12 is at the desired level, the difference of potential across conductors 21 and 22 of the differential amplifier means 20 is not sufficient to cause either the heating load means 35 or the cooling load means 48 to be energized. If the temperature at the thermistor 12 decreases thereby indicating that an increase in heat is needed, the difference in potential between conductors 21 and 22 increases. This unbalances the differential amplifier means 23 and causes a greater differential voltage between the conductors 24 and 25 and of such polarity that then the transistors 26 and 27 begin to conduct. The current ($I_H$) conducted through transistors 26 and 27 flows through the resistor 32 thereby providing a bias for transistor 33 causing it to go into conduction. Current flows from the terminal 36 through the heating load means 35, conductor 34 and transistor 33 thereby energizing the heating loads means 35 and simultaneously supplying current through the parallel resistance 55 which is the heat anticipator. Also at the same time the change in potential is supplied via conductor 56 through the positive feedback resistor 57 and conductor 58 to the input of bridge means 11 thereby causing the transistor 33 to switch in function rather than to provide a modulating function. The heating load means 35 may be of any convenient type such as a relay to control a furnace, electric heat, or any other suitable source of heating for the ambient to which the negative temperature coefficient thermistor 12 is exposed. If the bridge is then brought back into a balanced condition, the output on conductors 21 and 22 is insufficient to cause operation of the heating load.

If the temperature at the thermistor 12 increases sufficiently to cause the need for cooling, the potential difference between conductor 21 and 22 increases, but in an opposite polarity from that previously described. This in turn causes the differential amplifier means 23 to become active in increasing the differential between conductors 24 and 25 so as to cause current to flow in the transistors 30 and 31. Current ($I_C$) flowing in transistor 31, when still of low value, flows in part through resistor 41 and the base-to-emitter circuit of transistor 42, and partly through the parallel path made up of conductor 43, diode 44 and resistor 45. However, under these conditions, only a negligibly small amount of current flows in the base-to-emitter circuit of transistor 46. Thus transistor 46 does not yet conduct at all whereas transistor 42 is conducting. The collector of transistor 42 is connected by means of conductor 50, impedance 51, conductors 52 and 53 to bridge leg 18. Essentially transistor 42, in series with impedance 51, is in parallel with bridge leg 18. Therefore following an increase in sensor 12 temperature which appears as a decrease in sensor 12 resistance (which in turn is equivalent to an increase in the resistance of bridge leg 18), a very small current $I_C$ in transistor 31 will make transistor 42 conductive and thus effectively place a variable resistance in parallel with leg 18. This has the same effect as if leg 18 itself had been reduced in resistance which offsets the effect of the sensor temperature increase. However, the lowest resistance that can be placed in parallel with bridge leg 18 is determined by impedance 51. It can be seen that this represents extremely strong degeneration so that the current level in transistor 31 only barely increases (insufficient to cause base-to-emitter current in transistor 46) as the sensor temperature keeps on increasing. At same point, determined by the magnitude of impedance 51, transistor 42 is completely on, and from then on further increases in sensor temperature and thus also current $I_C$ in transistor 31 have no further effect on transistor 42 and the negative feedback operation furnished by transistor 42 has come to an end and the circuit operates again with its normal high gain. Upon a further sensor temperature increase, the current $I_C$ in transistor 31 increases to a higher value at which output transistor 46 receives a small value of base-to-emitter current, and transistor 46 is made to switch on regeneratively through use of the positive feedback resistor 62. It is thus apparent that the cooling load cannot be brought into operation until the transistor 46 obtains a turn-on bias developed across resistor 45. This cannot occur until the transistor 42 has been saturated and the saturation point of transistor 42 is selected by the value of the feedback impedance 51. It is thus further apparent that the point at which the transistor 42 becomes saturated can be readily adjusted by selecting the value of the impedance means 51. It is noted that impedance means 51 is external to the ten-terminal integrated circuit 10 and thereby can be readily changed without affecting any of the rest of the present circuit.

With the present invention it is possible to provide an adjustable amplifier system that operates from a fixed reference in response to a signal source means. The operation is accomplished by a feedback amplifier means wherein the feedback amplifier means has a variable feedback means that connects back to the original signal source means. The feedback amplifier means further has an impedance means in its input circuit that is made up of a diode means and resistor in series and which develops a voltage across a portion of the impedance means which controls the cooling control load at a threshold operating point or level. When the present invention is utilized as an adjustable differential condition responsive control system, the fixed reference becomes the heating control circuit while the cooling control circuit still remains variable depending on the amount of feedback involved. This will be brought out more in detail in connection with the diagrams of FIGS. 2 and 3.

Figure 2:
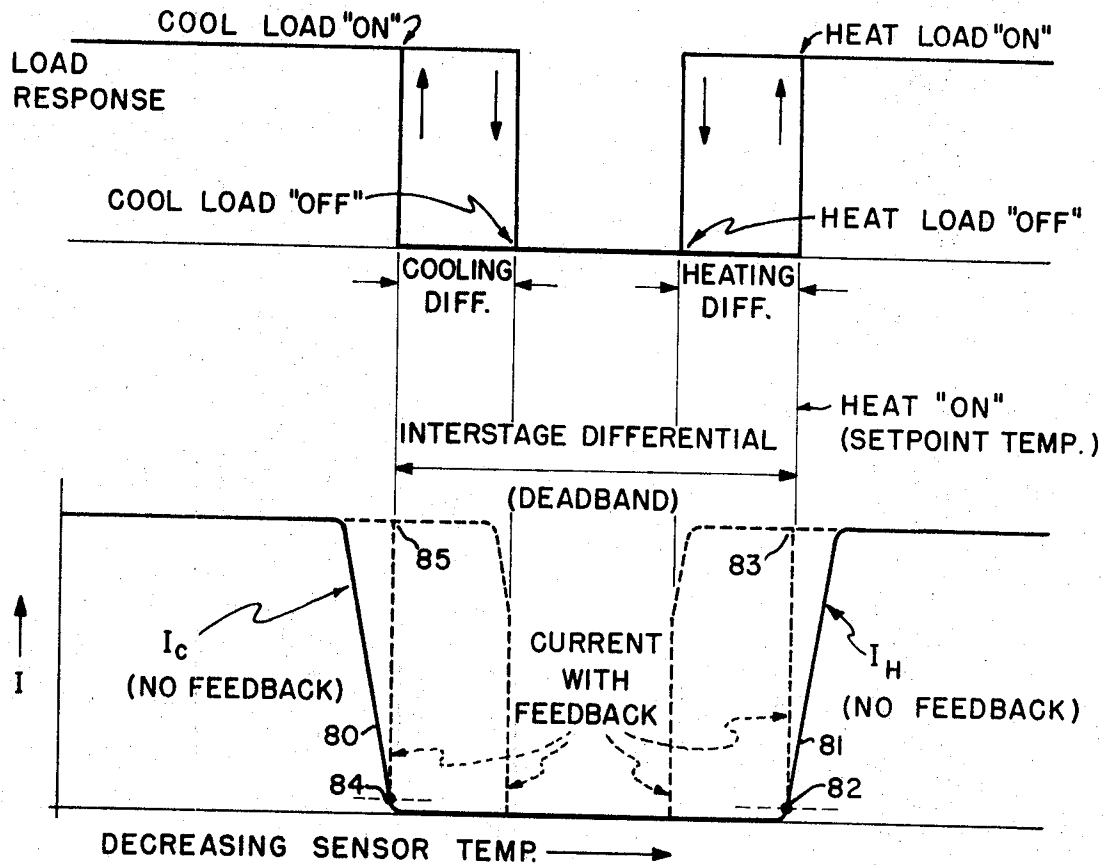
FIG. 2 is a graph of load response and current versus temperature of the system for one particular value of feedback resistance.

FIG. 2 is an exaggerated curve of current and load response versus temperature occurring in the system disclosed in FIG. 1. The cooling portion of the curve shows the current flow 80 ($I_C$) from transistor 31 while the current flow 81 ($I_H$) is the heating current from transistor 27. It will be noted that the curves of the currents 80 and 81 are generally symmetrical and show what would happen if no feedback was present.

If the heating portion of the cycle is considered, current 81 rises from zero through a point 82 at which the heating load means 35 is switched on at 83 if sufficient positive feedback is used. This increase in current occurs as the temperature decreases at the sensor or thermistor 12.

If the temperature of the sensor increases so as to cause it to reach a level coinciding with a point 84, current begins to flow from transistor 31 as represented by the current curve 80. At 84 the cooling load means 48 is switched on at 85 if sufficient positive feedback is used. A heating differential and a cooling differential are shown in FIG. 2 and are created by the feedback in the circuit. The differentials are hysteresis loops caused by the feedback acting on the bridge means 11. By definition, the difference in temperature change between the temperature represented at point 84 and the point 82 is referred to as the deadband or the interstage differential. In effect this is the temperature variation over which a changeover effect from heating to cooling and vice versa occurs. In a manual changeover system, the deadband is replaced by a manual switch and would not automatically occur as in the present circuit.

With the arrangement as disclosed, the deadband is fixed for any fixed value of the impedance means 51. This for all practical purposes fixes the temperature differential between the current curves 80 and 81. Since the present system is basically made using a ten-terminal integrated circuit 10, it is impossible to change the deadband by altering any of the circuit components within the intergated circuit. By providing the external variable impedance or resistance 51, a variation in the deadband can be accomplished. This is disclosed in FIG. 3.

Figure 3:
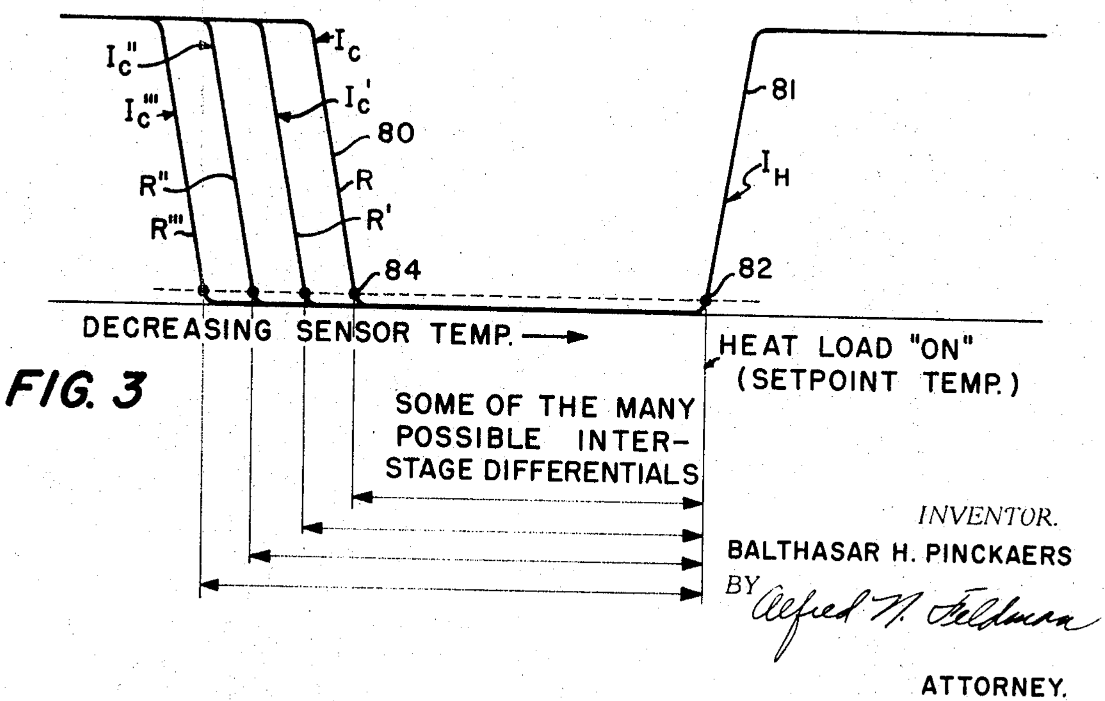
FIG. 3 is a curve similar to FIG. 2 but showing a family of curves for the adjustable amplifier in the system wherein a number of different resistance values are in the feedback circuit.

In FIG. 3 a variable group of cooling curves similar to that in FIG. 2 are disclosed. The heating current curve 81 remains the same while four cooling current curves $I_C$, $I_C'$, $I_C''$, and $I_C'''$ are shown. The current curve $I_C$ is for some fixed value of resistance R of resistor 51 whereas the curve $I_C'$ corresponds to a different value of resistance R'. This is true of curve $I_C''$ which corresponds to a resistance value R'' and curve $I_C'''$ corresponds to a still further resistance value R'''. It will be noted that all of the curves for the varying resistances are at the same slope, thereby keeping the characteristics constant even though the distance between the curves $I_C$ and $I_H$ can be varied, thus varying the deadband or interstage differential. It is thus obvious that the deadband can be readily varied merely by changing an external impedance in the form of resistance 51.

In FIG. 4 a slight circuit modification is disclosed for the feedback amplifier means 40. The transistor 42 is again disclosed along with resistor 41 and resistor 45 which controls the transistor 46. In the circuit disclosed in FIG. 4 the diode 44 of FIG. 1 has been replaced by a resistor 86. The operation of the circuit is the same, but the circuit disclosed in FIG. 1 has a slightly more uniform characteristic since the voltage drop across the base-to-emitter portion of the equivalent diode 44 remains constant as the current through the diode 44 changes but the voltage drop across resistor 86 would vary as the current flow through it varied. For this reason the circuit disclosed in FIG. 1 wherein the diode 44 is used in place of resistor 46 is preferable, though it is not essential.

The present invention discloses and claims a very simple adjustable differential condition responsive system specifically disclosed as a temperature control system. It is obvious that the type of control could be in other areas than temperature and further that the invention is not limited to the control system but is also directed to the adjustable amplifier aspects wherein negative or positive feedback circuits having a variable component is involved. The present invention can be varied in its mode of application and in its circuit details without varying from the scope of the present invention.

The embodiments of the invention in which an exclusive property or right is claimed are defined as follows:

1. An adjustable differential condition responsive system, including: condition sensing means including differential signal source means and including differential amplifier means having first output circuit means and second output circuit means; feedback amplifier means having output circuit means and having input circuit means connected to said first output circuit means of said signal source means; said feedback amplifier output circuit means including variable negative feedback means connected to said condition sensing means; impedance means included in said feedback amplifier input circuit means; a first load control means having a threshold operating level adapted to control a first load in response to said condition sensing means from a voltage developed across a portion of said impedance means; and second load control means connected to said signal source second output circuit means and adapted to control a second load in response to said condition sensing means.

2. An adjustable differential condition responsive system as described in claim 1 wherein said variable negative feedback means includes a resistor the value of which is selected to adjust the operation of said load to a selected variation of said condition sensing means.

3. An adjustable differential condition responsive system as described in claim 1 wherein said impedance means is resistive.

4. An adjustable differential condition responsive system as described in claim 1 wherein said impedance means includes diode means and resistor means in series circuit.

5. An adjustable differential condition responsive system as described in claim 1 wherein said condition sensing means is a temperature responsive bridge, and said first and second load control means each include switch means to energize temperature altering loads which work against ambient temperature changes to keep said bridge balanced.

6. An adjustable differential condition responsive system as described in claim 4 wherein said condition sensing means is a temperature responsive bridge, and said first and second load control means each include switch means to energize said temperature altering loads which work against ambient temperature changes to keep said bridge balanced.

7. An adjustable amplifier system, including: signal source means having output circuit means; feedback amplifier means having output circuit means and having input circuit means connected to said signal source output circuit means; said feedback amplifier output circuit means including variable negative feedback means connected to said signal source means; impedance means including series connected diode means and resistor means included in said feedback amplifier input circuit means; and load control means having a threshold operating level adapted to control a load in response to said signal source means from a voltage developed across a portion of said impedance means.

8. An adjustable amplifier system as described in claim 7 wherein said signal source means is a temperature responsive bridge, and said load control means includes switch means to energize a temperature altering load which works against ambient temperature changes to keep said bridge balanced.

References Cited

UNITED STATES PATENTS

| | | | |
|---|---|---|---|
| 2,868,458 | 1/1959 | Moore | 328—3 X |
| 3,161,782 | 12/1964 | Vieth | 236—78 X |
| 3,305,734 | 2/1967 | Buttenhoff | 328—3 X |

ROY LAKE, Primary Examiner

J. B. MULLINS, Assistant Examiner

U.S. Cl. X.R.

165—26; 219—510; 236—78; 328—3